AMPLIFIERS WITH DELAYED TURN-ON
Filed July 25, 1962
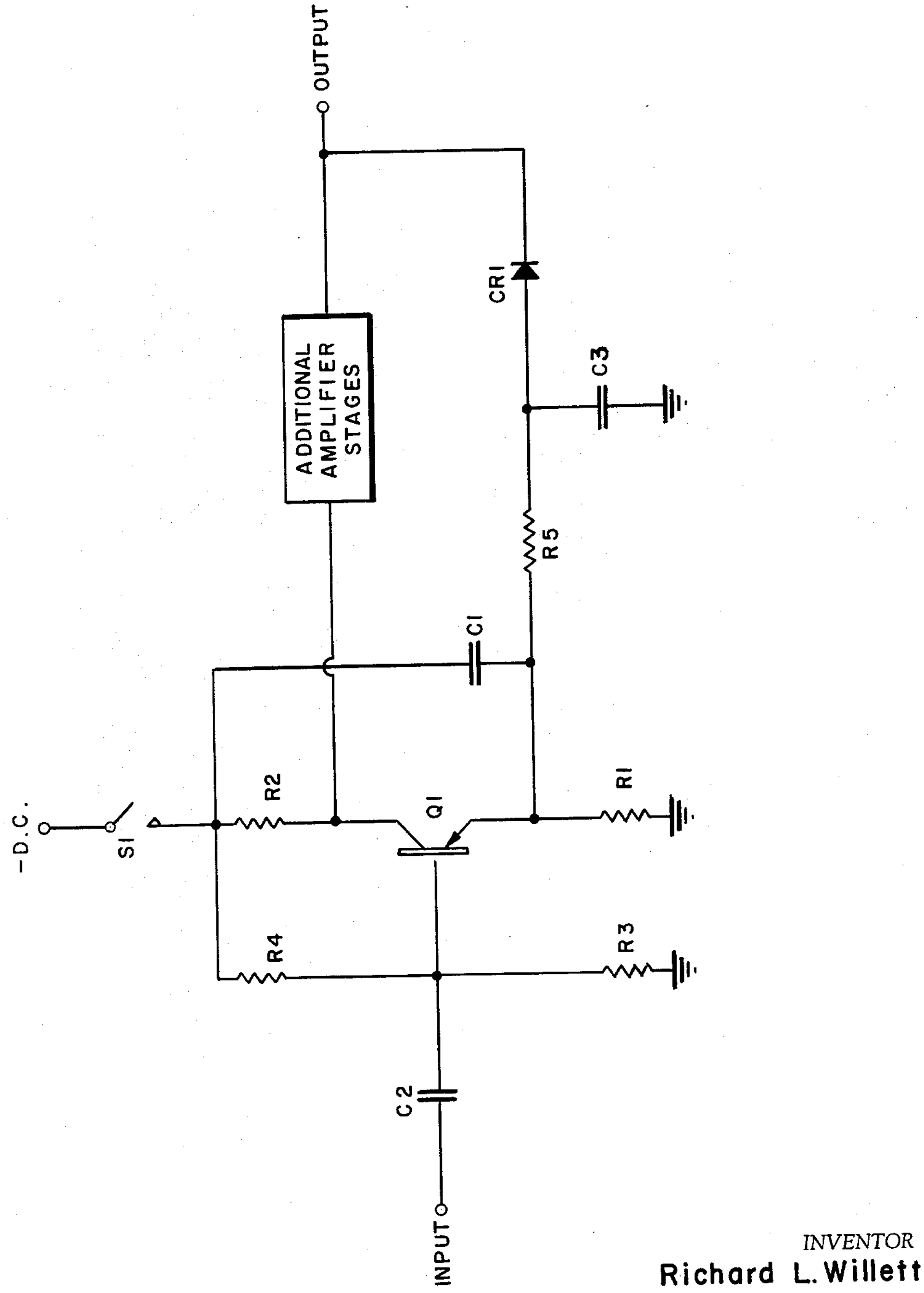
INVENTOR
Richard L. Willett
Richard F. Mack
BY Arnold and Roylance
ATTORNEYS United States Patent Office 3,259,849
Patented July 5, 1966

3,259,849

AMPLIFIERS WITH DELAYED TURN-ON

Richard L. Willett, Bel Air, and Richard F. Mack, Baltimore, Md., assignors to Martin-Marietta Corporation, Baltimore, Md., a corporation of Maryland Filed July 25, 1962, Ser. No. 212,271
2 Claims. (Cl. 330—29)

This invention relates to electronic circuits which do not become operative for a predetermined interval of time after the circuit operating potential has been turned on. It has particular application to amplifiers incorporating automatic gain control (AGC) and delayed turn-on features.

There are numerous applications in which it is desirable to have an electronic circuit, such as an amplifier, remain inoperative for a period of time after the operating power has been turned on. One such application is in the receiver of a radio controlled missile. It is necessary to apply the operating potentials to the receiver circuitry at the time the missile is launched. Since the control transmitter is normally located at or near the point of launching, the missile will be so close to the transmitter for the first few moments after launch that transmitter signals would tend to swamp the missile receiver if it were operative. At this close range, it is probable that even a receiver equipped with AGC would be swamped and perhaps damaged, since the power of the transmitted signal would be beyond the dynamic range of the AGC circuit. It is desirable, therefore, to provide a receiver circuit, such as an amplifier, with a delayed trun-on, so that it does not become operative until the transmitter-missile distance has become large enough for the level of the transmitted signal received by the missile to be within the range of capability of the missile receiver circuitry.

It is an object of this invention to provide an electronic circuit having a delayed turn-on capability.

It is a further object of this invention to provide an amplifier having both a delayed turn on capability and automatic gain control and in which simplicity of design and economy of construction are achieved by using the most expensive circuit element as part of both the AGC circuit and the time delay circuit.

These objectives are achieved in one embodiment of this invention by providing a transistor amplifier in which a capacitor is connected between the source of operating potential and the transistor emitter. When the operating potential is turned on, it is coupled instantaneously to the emitter, reverse biasing the transistor and holding it nonconductive until the capacitor has charged. When the capacitor has charged sufficiently to permit the transistor to become forward biased, the transistor conducts and the amplifier becomes operative. An AGC feedback loop is also connected to the emitter, with the same capacitor functioning as a filter capacitor for the AGC current.

The invention may be more readily understood by reference to the following detailed description taken in conjunction with the drawing, which forms a part of this specification, and which is a schematic diagram of this invention embodied in a transistor amplifier.

Referring to the figure, a source of negative D.-C. operating potential is supplied through on-off switch S1 and resistor R2 to the collector of PNP transistor Q1. The emitter of Q1 is connected to ground through resistor R1. Transistor bias is supplied by the series circuit comprising resistors R3 and R4; with R3 being connected between ground and the base of transistor Q1, and R4 being connected between the base of Q1 and the junction of resistor R2 with switch S1. The input terminal is connected to the base of transistor Q1 through capacitor C2.

Time delay capacitor C1 is connected between the emitter of Q1 and the junction of resistor R2 and switch S1. The collector of Q1 is connected through additional amplifier stages to the output terminal. The output terminal is connected to the cathode of diode CR1. The anode of diode CR1 is connected to one plate of capacitor C3, and the other plate of C3 is connected to ground. The anode of CR1 is also connected to one end of resistor R5, the other end of R5 being connected to the emitter of transistor Q1.

When negative D.C. operating potential is applied to the circuit by the closing of on-off switch S1, this negative potential is instantaneously coupled to the emitter of transistor Q1 by capacitor C1. The negative supply voltage is also applied to one end of the bias network of R3 and R4, and the base of Q1 instantaneously assumes its normal bias voltage, which is slightly above ground potential. As soon as switch S1 is closed, then, the emitter of Q1 is at the negative supply potential and the base of Q1 is at some more positive potential. The emitter-base diode of PNP transistor Q1 is reverse biased, Q1 will not conduct, and any signal appearing on the input terminal will not be amplified through the circuit.

Capacitor C1 will immediately commence to charge through emitter resistor R1. Since the upper plate (as-viewed) of C1 is held at the negative supply potential, the potential on the lower plate, which was initially also at the negative supply potential, will become increasingly more positive during the charging operation. As soon as the capacitor has charged to a point where the emitter-base diode of Q1 becomes forward biased, Q1 will conduct and the circuit will be operative to amplify any signals appearing on the input terminal. The duration of the time delay is of course a function of both capacitor C1 and resistor R1, and may be adjusted by varying the value of either of these components.

When the circuit is operative after the lapse of the time delay period, input signals are amplified by Q1, fed from the collector of Q1 to the additional amplifier stages, and ultimately to the output terminals. The additional stages of amplification are not necessary to the operation of the circuit; and if one stage provides sufficient signal amplification for the particular application, the collector of Q1 may be connected directly to the output terminal.

The signal appearing at the output terminal is fed back to the transistor through the appropriate circuitry to supply automatic gain control (AGC) to the Q1 amplification stage. The output signal is rectified by diode CR1; filtered by capacitor C3, resistor R5 and capacitor C1; and fed to the emitter of Q1. The polarity of diode CR1 permits only negative-going signals from the output to pass through to the filter. When these negative-going current pulses are smoothed by the filter, the resulting current is fed through emitter resistor R1, reducing the emitter current of Q1 and consequently its amplification. The larger the output signal, the more AGC current will be fed back to Q1, and the more its amplification will be reduced.

Note that capacitor C1, in addition to functioning as a timing capacitor and as a filter capacitor for the AGC signal, is effectively connected in parallel with emitter resistor R1, and consequently performs an additional function by serving as the emitter bypass capacitor.

Each of the three functions which capacitor C1 performs requires a relatively large value of capacitance, and such a capacitance is ordinarily the most expensive component in the circuit. By this novel configuration, in which all three functions are performed by the same capacitor, therefore, a circuit has been provided which has the desired performance characteristics and which is simple in operation and inexpensive to construct.

Other arrangements and modifications of the invention described herein as will suggest themselves to those skilled in the art may be made without departing from the scope of the invention, which is defined solely in the claims.

What is claimed is:

1. An electronic circuit comprising:
- a source of operating potential adapted to be turned on and off;
- a transistor having at least three electrodes and connected to operate from said source as an amplifier;
- means including filter means connected to an ouput electrode of said transistor for developing a substantially D.C. control voltage and for feeding said control voltage back to one electrode of said transistor;
- a capacitor;
- said filter means including said capacitor;
- an impedance connected in series with said capacitor and forming therewith a charging network;
- said one electrode being connected to said charging network at a point between said capacitor and said impedance; and
- said charging network being connected across said source in such a manner that the initial voltage across said capacitor when said source is turned on serves to bias said transistor off, and thereafter said capacitor charges toward a voltage tending to turn said transistor on.

2. An electronic circuit in accordance with claim 1 and wherein further:
- said circuit contains an input for receiving a signal to be amplified by said circuit;
- said transistor electrodes comprise a base electrode and two other electrodes;
- said input is connected to said base electrode; and
- said point on said charging network betwen said capacitor and said impednace is connected to one of said other electrodes.

References Cited by the Examiner

UNITED STATES PATENTS

| | | | |
|---|---|---|---|
| 3,021,489 | 2/1962 | Nielsen | 330—29 |
| 3,060,350 | 10/1962 | Rywak. | |
| 3,082,329 | 3/1963 | Meyer et al. | 328—86 X |

OTHER REFERENCES

Shea, R. F.: Principles of Transistor Circuits, John Wiley and Sons, Inc., New York, 1953.

ROY LAKE, *Primary Examiner.*

F. D. PARIS, T. M. WEBSTER, *Assistant Examiners.*